United States Patent [19]
Bauer et al.

[11] Patent Number: 5,491,351
[45] Date of Patent: Feb. 13, 1996

[54] GATE TURN-OFF THYRISTOR

[75] Inventors: Friedhelm Bauer, Ittigen; Peter Streit, Widen, both of Switzerland

[73] Assignee: ABB Management AG, Baden, Switzerland

[21] Appl. No.: 330,189

[22] Filed: Oct. 27, 1994

[30] Foreign Application Priority Data

Oct. 30, 1993 [DE] Germany .......................... 43 37 209.0

[51] Int. Cl.⁶ .......................... H01L 29/74; H01L 29/50; H01L 29/60
[52] U.S. Cl. .......................... 257/152; 257/163; 257/172
[58] Field of Search .......................... 257/144, 152, 257/163, 148, 164, 172

[56] References Cited

FOREIGN PATENT DOCUMENTS

| | | | |
|---|---|---|---|
| 0074133 | 3/1983 | European Pat. Off. | 257/152 |
| 0171474 | 2/1986 | European Pat. Off. | 257/152 |
| 0326018 | 8/1989 | European Pat. Off. | 257/152 |
| 0366916 | 5/1990 | European Pat. Off. | 257/152 |
| 0389942A1 | 10/1990 | European Pat. Off. | 257/163 |
| 3044123 | 6/1982 | Germany | 257/152 |
| 2844283 | 7/1985 | Germany | 257/152 |
| 57-78172 | 5/1982 | Japan | 257/152 |
| 59-52875 | 3/1984 | Japan | 257/152 |
| 2-17674 | 1/1990 | Japan | 257/152 |
| 2-159067 | 6/1990 | Japan | 257/152 |
| 2-296370 | 12/1990 | Japan | 257/152 |
| 3-272179 | 12/1991 | Japan | 257/152 |

OTHER PUBLICATIONS

Burkhard, J. D., "Copper Wirebond Barrier Metallization", In Motorola Inc. Technical Developments, Dec. 1991, vol. 14, S. 124.

Tsutomu Yatsuo, et al, "Ultrahigh–Voltage High–Current Gate Turn–Off Thyristors", In IEEE Trans. Electron Devices, vol. ED–31, Dec. 1984, S. 1681–1686.

Nakoto Azuma, et al, GTO Thyristors, In Proceedings of the IEEE, vol. 76, No. 4, Apr. 1988, S.419–427.

Towner, J. M. "The Importance of the Short–Circuit Failure Mode in Aluminum Electromigration", In J. Vac. Sic. Technol. B, Nov./Dec. 1987, S. 1696–1700; S. 1696; li.Sp., 2. Abs., S. 1697, li. Sp., 2 Abs.

Chin–An Chang, "Reaction Between Cu and Ptsi with Cr, Ti, W, and C Barrier Layers", In Appl. Phys. 67, 15 May, 1990, S. 6184–6188.

*Primary Examiner*—Donald L. Monin, Jr.
*Attorney, Agent, or Firm*—Oblon, Spivak, McClelland, Maier & Neustadt

[57] ABSTRACT

A GTO having a cathode emitter (7) is specified, which cathode emitter has a low emission efficiency. This cathode emitter (7) provides a clearly increased resistance to the formation of current filaments. As a result, relatively high turn-off current densities can be reliably mastered. In addition, the fraction of the hole current in the total current is more than 10%. This is achieved, for example, by selecting the penetration depth as <1 μm and the edge concentration as $<10^{19}$ cm$^{-3}$.

20 Claims, 3 Drawing Sheets

GATE TURN-OFF THYRISTOR

BACKGROUND OF THE INVENTION

1. Field of the Invention

The invention relates to the field of power semiconductor components.

It proceeds from a turn-off power semiconductor component according to the preamble of the first claim.

2. Discussion of Background

Such a turn-off power semiconductor component is well known and is described, for example, in the article entitled "GTO Thyristors" by Makoto Azuma et al. (Proceedings of the IEEE, Vol. 76, No. 4, April 1988).

Turn-off power semiconductor components of this type are assembled from a multiplicity of standard cells, and have a number of differently doped layers between two main surfaces. Starting from the anode, an n-base and a p-base succeed a, for example p-doped, anode emitter. n-doped cathode emitter regions are recessed into the p-base. Of course, the layers can also be inversely doped. Such components are also known as GTO (Gate Turn-Off Thyristors).

In the case of such gate turn-off thyristors, the penetration depth of the cathode emitter regions in the direction of the anode is selected such that a maximum emitter efficiency results. This is achieved in design terms in present-day GTOs by providing that the cathode emitter has an edge concentration of $10^{20}$ cm$^{-3}$ and a depth of the pn junction of approximately 10 μm. The result is that the fraction of the minority carrier current in the emitter is normally below 1%. Because of the high emitter efficiency, the space below the emitter is filled with a very high plasma density, and this ensures the required, low conducting-state power losses. However, the high plasma density tends to instability, in particular in the case of turn-off. The consequences for present-day GTOs are known: limited turn-off capacity and current filamentation. In order to limit the influence of these disadvantages, lifetime-reducing measures such as irradiation and the production of recombination centers are undertaken in the GTO. Furthermore, the anodes of the GTOs are provided with strong anode short circuits for extracting the plasma as quickly as possible during turn off. However, like the production of recombination centers, as well, this measure substantially worsens the conduction of the component. The present-day dimensioning philosophy is therefore self-contradictory.

Already today, but to an even greater extent in future applications, high demands are placed on the current and voltage loadability of the power semiconductor components. Here, the abovementioned disadvantages set limits to the present-day, known GTOs, because they can be destroyed, in particular by excessively high local loads, due to current filamentation. In order to prevent this destruction, the present day GTOs must be operated with an extensive protecting circuit.

SUMMARY OF THE INVENTION

Accordingly, one object of this invention is to provide a novel turn-off power semiconductor component which, while preserving small conducting-state power losses and turn-off power losses, as a substantially improved turn-off capacity, that is to say higher, turn-off current densities at high voltages, and thus also a substantial reduction or elimination of the protecting circuit. The impoved turn-off capacity is also reflected in a simplification and reduction of the drive units.

This object is achieved in the case of a turn-off power semiconductor component of the type mentioned at the beginning by means of-the features of the first claim.

Thus, the core of the invention is to configure the cathode emitter of a GTO in terms of design such that the instability due to current filamentation is largely eliminated. By contrast with the known solution of reducing the lateral extent of the emitter fingers, the cathode emitter is designed such that it has a low emitter efficiency. As a result, more than 10% of the total current in the cathode emitter are carried by minority carriers. In the case of high current densities typical of current filaments, the described combination of emitter doping profile and emitter metalization leads to a drastic worsening of the emitter efficiency. The reduction in emitter efficiency at the operating-current density is, however, negligibly small, with the result that the conduction is not worsened.

The effect of the described property of the cathode emitter is an efficient limitation of the degree of current-density inhomogeneity possible in the structure, with the result that current filaments no longer lead to local overloading of the component. This increased stability has a positive effect not only in increasing the turn-off currents, but also in reducing the components of the protecting circuit.

If the core of the invention is likewise applied to the anode side of the component, it is also possible to reduce the thickness in conjunction with an unchanged blocking capacity. The turn-off losses can be drastically reduced as a result. Experiments have shown that for a fixed current density the turn-off losses no longer increase quadratically—as in the prior art—but only linearly with voltage.

A first exemplary embodiment is distinguished in that the cathode emitter regions according to the invention are surrounded by means of saturating injection at high current densities at their edge by a thicker emitter part than according to the prior art. Improved firing characteristics are obtained as a result.

In a further exemplary embodiment, the cathode emitter regions are permeated by oppositely doped islands. The same positive effect of saturating injection with increasing current density is achieved by means of these oppositely doped islands. This exemplary embodiment permits the depth of the cathode emitter regions to be increased. This has advantages chiefly in terms of process engineering.

It is possible in all the designs to provide anode short circuits on the anode-side main surface. These short circuits can likewise be combined with an anode-side stop layer. Furthermore, all the designs can be executed with an anode-side stop layer and an anode emitter of low emission efficiency.

Further exemplary embodiments follow from the subclaims.

Thus, the invention makes available a turn-off power semiconductor component by means of which high currents and voltages can be mastered without difficulty and without current filamentation. As a result, the outlay on components of the protecting circuit can be reduced. In addition, the power semiconductor component according to the invention has relatively low turn-off losses.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
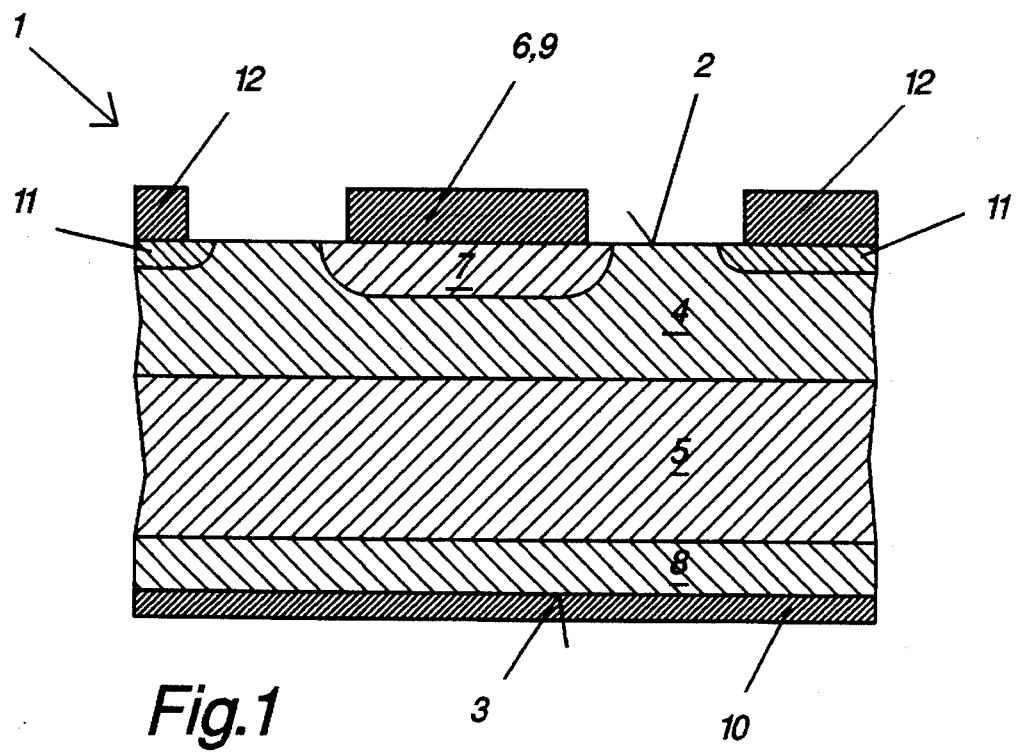
FIG. 1 shows a detail of a power semiconductor component according to the invention, in section.

The designations used in the drawings are listed in a summary together with their meanings in the list of designations.

DESCRIPTION OF THE PREFERRED EMBODIMENTS

Referring now to the drawings, wherein like reference numerals designate identical or corresponding parts throughout the several views, FIG. 1 shows a detail of a power semiconductor component (1) according to the invention, in section. A number of differently doped layers are arranged between two main surfaces (2, 3). Starting from the cathode-side main surface (2), a p-base (4), an n-base (5) and a p-anode emitter (8) succeed one another. The anode is formed by the anode emitter (8) which is covered on the anode-side main surface (3) by an anode metalization (10). The cathode (6) is formed by n+ doped cathode emitter regions (7) which are recessed into the p-base (4) and are covered by a cathode metalization (6). In order to be able to turn the component on and off, p+ doped gate regions (11) are additionally provided which are covered by a gate metalization (12) and together form a gate electrode.

The statements made above have so far described a conventional gate turn-off thyristor (GTO). In contrast to the conventional GTOs, which are designed to a maximum emitter efficiency, as a result of which, however, the above-mentioned disadvantages are brought along and for which reason they are of limited use, the invention adopts an entirely different approach:

Instead of designing the cathode emitter (7) to maximum efficiency, it is configured in such a way that a fraction of the hole current which increases with increasing total current penetrates the cathode emitter in a recombination-free fashion. Thus, with increasing total current the emission of electrons stagnates, with the result that the total current rises substantially less strongly with the forward voltage than in the case of a conventional emitter designed to maximum efficiency. This characteristic of the emitter is achieved, for example, by providing that the n-doped zone has a penetration depth of the order of magnitude of fractions of μm, but at most of 2 μm. With the aid of such an emitter profile, success is achieved in keeping the recombination of the minority carriers—in this case, of the holes so small that a significant fraction (>10%) of the total current is carried by the holes in the cathode emitter. This circumstance is the reason why a fraction of the hole current which is substantially smaller by comparison with present-day GTOs is directed via the gate for turning-off purposes.

Thus, an adjustable fraction of the hole current can be extracted by the cathode emitter owing to the inventive characteristic of the cathode emitter. As just remarked, as a result the functioning of the gate is substantially relieved, with the result that fewer high gate currents are required for turning-off purposes in normal operation. Moreover, the occurrence of current filaments is successfully prevented. In addition to the characteristics, already sketched out, of the cathode emitter according to the invention, a further important point to add is that the contact between the cathode emitter and cathode metal has no ohmic characteristic. Because of the comparatively low edge concentration of the cathode emitter of $10^{19}$ cm$^{-3}$ or less, during metalization by means of aluminum a so-called Schottky barrier is formed which opposes the flow of current with a substantially increased resistance compared to an ohmic contact. The voltage drop, rising with rising current, across the nonlinear contact resistance reduces the emitter forward voltage, with the result that the emission of the cathode emitter is further weakened. The effect of this nonlinear contact resistance is comparable with the effect of an external emitter ballast resistor whose stabilizing effect on the current density distribution during turn-off is known. According to a preferred exemplary embodiment, the effect of the ballast resistor is substantially intensified by the emitter characteristic.

Figure 2:
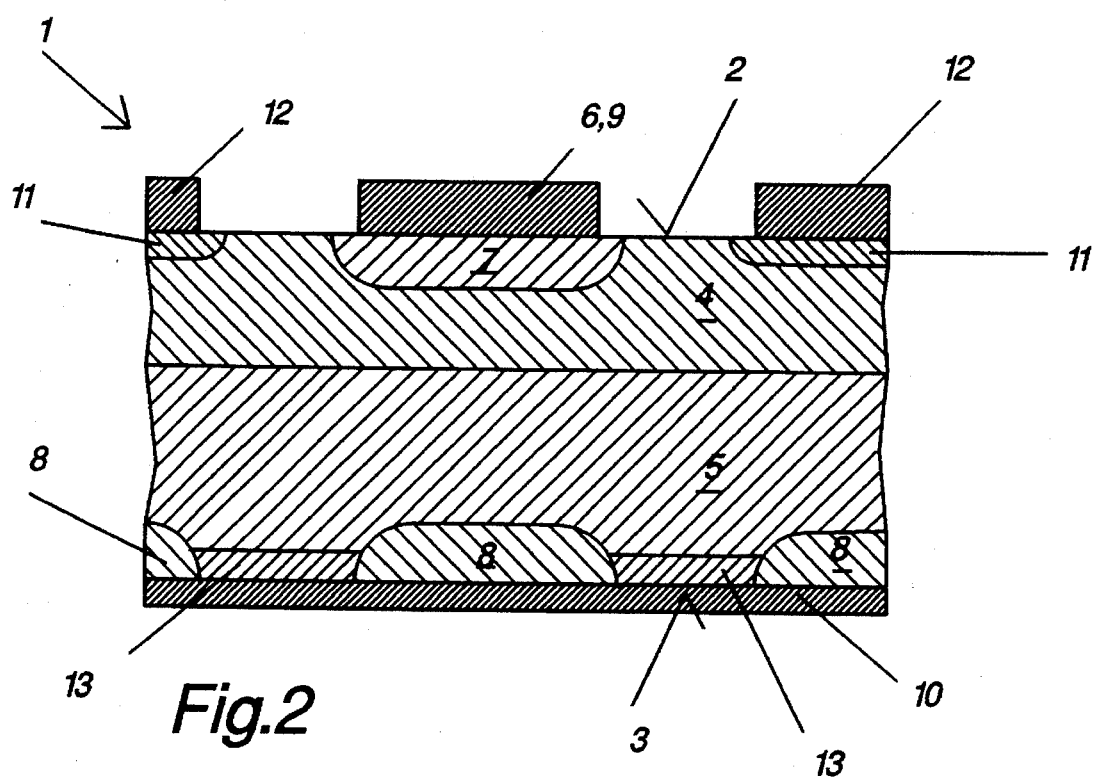
FIG. 2 shows a variant of the power semiconductor component according to the invention.

As FIGS. 1 and 2 show, the anode emitter (8) can be implemented as a continuous p+ doped layer (FIG. 1) or as permeated by n+ doped anode short circuits (FIG. 2). Both anode structures can, furthermore, be implemented with an anode-side stop layer (16)—represented in FIG. 4a.

Figure 3A:
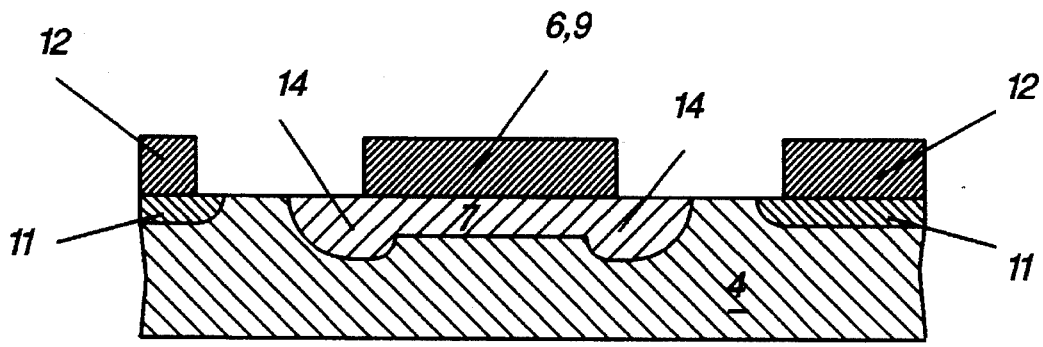
FIGS. 3a–b shows further cathode variants of the power semiconductor component according to the invention.

Moreover, as represented in FIG. 3a, the cathode emitter (7) can also be implemented in two parts. In this case, the emitter (7) has at its edge regions (14) of high emission efficiency. The latter have a penetration depth of a few to some μm and an edge concentration of more than $10^{19}$ cm$^{-3}$. In the case of finger-shaped cathode emitter regions (7), the regions (14) of high emission efficiency thus represent a ring which surrounds the fingers completely. This arrangement has improved firing characteristics by contrast with that of FIG. 1. Specifically, the regions (14) of high emission efficiency are located in the vicinity of the gate contact (11, 12). Upon turn-off, the gate essentially withdraws charge carriers below the emitter edges (14). Since the emitter center can be passed for a large fraction of the hole current without electron emission, the pinch-off effect of the plasma does not occur in the usual negative form. An increase in the turn-off currents is thereby achieved. Moreover, because of the emitter edges (14) of high emission efficiency, the structure just explained has a lower forward resistance than the structure according to FIG. 1. On the anode side, an anode emitter (8) which is either continuous or permeated with short circuits (13) can be provided. Both anode structures can further be implemented with an anode-side stop layer (16) as in FIG. 4a.

Figure 4A:
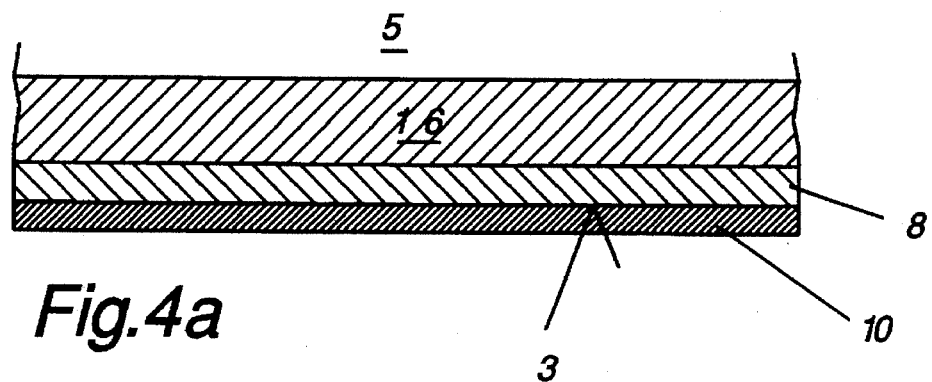
FIGS. 4a–b show two variants of anode structures of the power semiconductor component according to the invention.
Figure 4B:
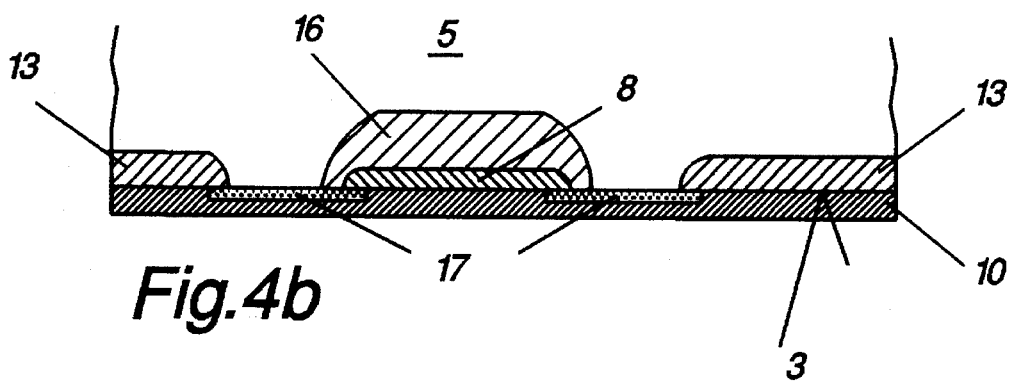

This and a further exemplary embodiment of the anode emitter are represented in FIGS. 4a and 4b. The anode-side, n+ doped stop layer (16) integrated in the n-base (5) permits the construction of a trapezoidal field-strength distribution in the blocking state and thus the use of a thinner substrate in a fixed maximum blocking voltage. As a result of this, conducting-state power losses and switching power losses can be greatly reduced in this exemplary embodiment. The charge carrier extraction can be further increased if in this case it is also possible for the anode emitter to be passed without a hole current for a large fraction of the electron current. As in the case of the cathode emitter, this characteristic can be achieved by flat and lowly-doped anode emitter regions.

An efficient charge carrier extraction can, however, also be achieved by providing anode short circuits (13) in addition to the stop layer (16). Because of the high conductivity (n+ doped) of the stop layer (16), the emission capacity of the p+ emitter (8) is, however, strongly limited. In order, nevertheless, to achieve a sufficiently large voltage drop, a comparatively high resistance must be produced between the anode metalization (10) and stop layer (16). Consequently, in FIG. 4b the regions of the n-base, which penetrate up to the anode-side main surface (3), are insulated from the anode metalization (10) by insulation regions (17).

Figure 3B:
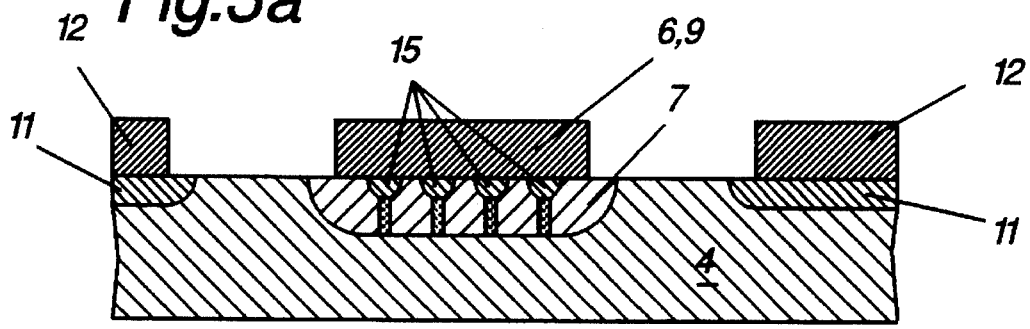

A further design of the structuring of the transparent cathode emitter (7) is represented in FIG. 3b. In order to obtain the emitter characteristic according to the invention, it is necessary to set values of $<10^{19}$ cm$^{-3}$ (for example, $10^{18}$ cm$^{-3}$) for the edge concentrations, and of fractions of μm for the penetration depth. However, this gives rise to two problems: firstly in the case of a metalization of an n-region lowly doped in such a way a nonlinear, high contact resistance is formed, which is caused by the occurrence of a Schottky barrier. The positive characteristics of this barrier which were described earlier can no longer be acceptable in the case of very low edge concentrations. Further difficulties arise due to the indiffusion of aluminum into the n-region with the risk of alloying through and of the short-circuiting of the n-region caused thereby. It would therefore be desirable for the transparent emitter regions (7) to continue to have edge concentrations of more than $10^{19}$ cm$^{-3}$ and penetration depths of more than 1 μm.

A cathode emitter (7) within the meaning of the invention can, nevertheless, be achieved by recessing into a conventional emitter profile with a comparatively high emission capacity a multiplicity of islands (15) which are oppositely doped. These islands (15) penetrate to a depth of the emitter layer (7) in which the minority carrier lifetime corresponding to the doping height is still relatively high. The minority carrier density is also then correspondingly high. The minority carriers thus leave the emitter via these indiffused islands (15). As a result, the regions below the islands (15) (emphasized by points) act as emitter regions with a weak electron emission. This design can also be used for a structure according to FIG. 3a by providing no islands in the edge region of normal high efficiency.

Figure 5A:
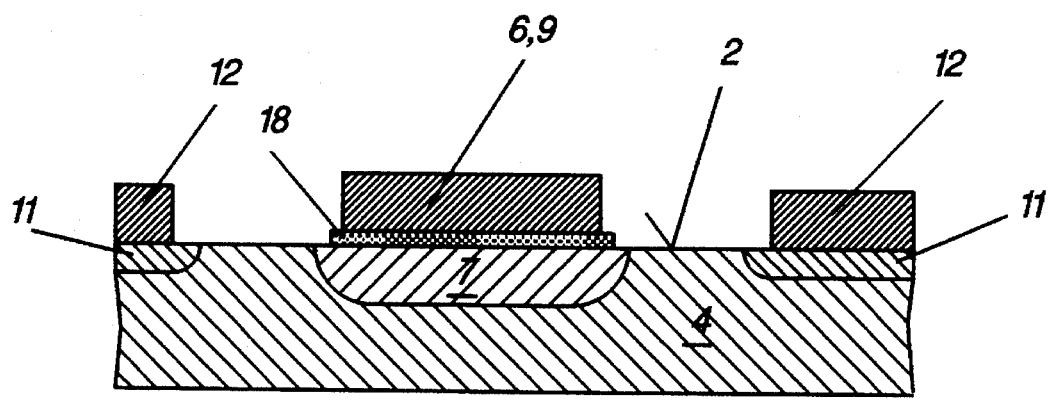
FIGS. 5a–c show further variants of anode structures.
Figure 5B:
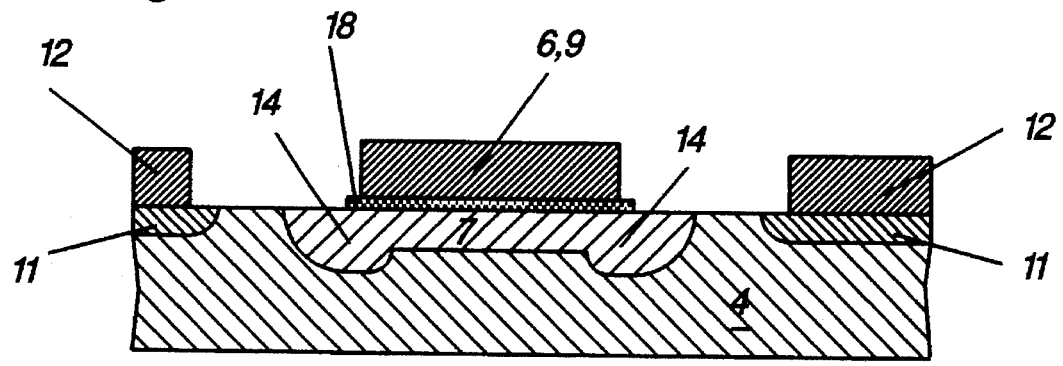
Figure 5C:
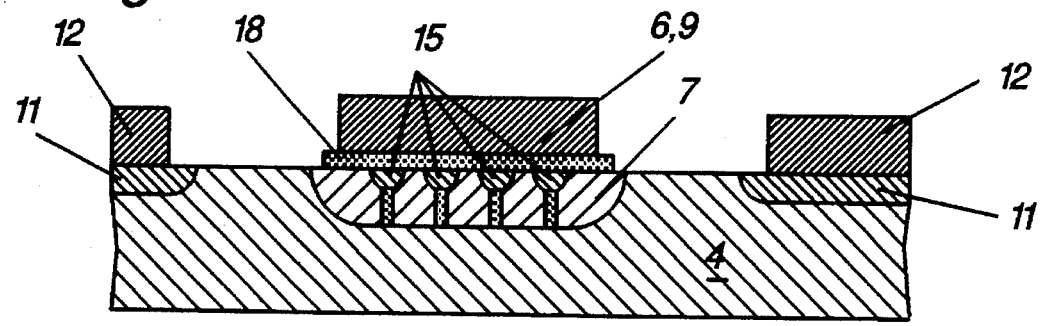

Further exemplary embodiments of the cathode emitter are, finally, represented in FIGS. 5a–c. In order to prevent the alloying-through explained above in the case of very flat cathode emitters (7), it is possible in addition to provide a diffusion barrier layer (18) between the metalization (9) and the cathode emitter (7). This diffusion barrier layer consists, for example, of vapor-deposited or sputtered and subsequently structured tungsten-titanium. Another possibility of preventing the alloying-through of the aluminum is to use aluminum already saturated with 1% silicon.

In general, all the cathode designs presented (FIGS. 1, 3a, 3b, 5a–c) can be combined with all the anode designs (FIGS. 2, 4a and 4b).

The invention thus arrives at the surprising effect that in opposition to the conventional expert opinion an emitter according to the invention can advantageously be applied even in the case of GTOs, and, particularly, is attended by the following advantages:

high turn-off current densities low gate currents, low outlay on circuitry, few static and dynamic losses.

Obviously, numerous modifications and variations of the present invention are possible in light of the above teachings. It is therefore to be understood that within the scope of the appended claims, the invention may be practiced otherwise than as specifically described herein.

LIST OF DESIGNATIONS

1 Power semiconductor component
2 Cathode-side main surface
3 Anode-side main surface
4 p-base
5 n-base
6 Cathode
7 Cathode emitter regions
8 Anode emitter
9 Cathode metalization
10 Anode metalization
11 Gate regions
12 Gate metalization
13 Anode short circuit region
14 Cathode emitter regions of high emission efficiency
15 p+ cathode emitter islands
16 Anode-side stop layer
17 Insulation regions
18 Diffusion barrier layer

What is claimed as new and desired to be secured by letters patent of the United States is:

1. A turn-off power semiconductor component comprising:

a cathode-side and a anode-side main surface;

a sequence of differently doped layers which are arranged between the cathode-side and the anode-side main surface, said sequence comprising, starting from the cathode-side main surface: a p-base, an n-base, and a p-doped anode emitter;

said component further comprising, on the cathode-side main surface, a cathode and, on the anode-side main surface, an anode; said cathode being formed by a multiplicity of n-doped cathode emitter regions recessed in the p-base and being covered by a metal layer, and said anode being formed by said p-emitter covered by a metal layer;

wherein said cathode emitter regions have a penetration depth of less than or equal to 2 μm and a doping rate with an edge concentration of less than or equal to $10^{19}$ cm$^{-3}$.

2. The power semiconductor component as claimed in claim 1, wherein the p-emitter is permeated by anode short circuit regions.

3. The power semiconductor component as claimed in claim 1, wherein an n-doped stop layer is provided between the n-base and the anode emitter.

4. The power semiconductor component as claimed in one of claim 1, wherein a) the anode emitters are implemented as interrupted regions which are surrounded by an n-doped stop layer, b) anode short circuit regions are provided in a fashion alternating with the anode emitter regions and stop layer regions, c) the n-base penetrates between the stop layer regions surrounding the anode emitter regions and the anode short circuit regions to the anode-side main surface; and d) a metalization covering the anode-side main surface is interrupted by insulation regions in the regions where the n-base penetrates to the anode-side main surface.

5. The power semiconductor component as claimed in claim 1, wherein a diffusion barrier layer is applied between the metal layer and the cathode-side main surface.

6. The power semiconductor component as claimed in claim 5, wherein the diffusion barrier layer consists of tungsten-titanium which is vapor-deposited or sputtered on.

7. The power semiconductor component as claimed in claim 5, wherein the penetration depth of the cathode emitter regions is fractions of μm, and the cathode emitter regions are doped with a carrier density of less than $10^{19}$ cm$^{-3}$.

8. The power semiconductor component as claimed in claim 1, wherein aluminum saturated with approximately 1% silicon is used as cathode metalization.

9. The power semiconductor component as claimed in claim 8, wherein the penetration depth of the cathode emitter regions is fractions of μm, and the cathode emitter regions are doped with a carrier density of less than $10^{19}$ cm$^{-3}$.

10. The power semiconductor component as claimed in claim 1, wherein the cathode emitter regions are surrounded at their edge by regions having a doping rate with a higher edge concentration and having a penetration depth which is approximately twice as large as that of the cathode emitter regions.

11. The power semiconductor component as claimed in claim 10, wherein the p-emitter is permeated by anode short circuit regions.

12. The power semiconductor component as claimed in claim 10, wherein an n-doped stop layer is provided between the n-base and the anode emitter.

13. The power semiconductor component as claimed in claim 10, wherein a) the anode emitters are implemented as interrupted regions which are surrounded by an n-doped stop layer, b) anode short circuit regions are provided in a fashion alternating with the anode emitter regions and stop layer regions, c) the n-base penetrates between the stop layer regions surrounding the anode emitter regions and the anode short circuit regions to the anode-side main surface; and d) a metalization covering the anode-side main surface is interrupted by insulation regions in the regions where the n-base penetrates to the anode-side main surface.

14. The power semiconductor component as claimed in claim 10, wherein a diffusion barrier layer is applied between the metal layer and the cathode-side main surface.

15. The power semiconductor component as claimed in claim 10, wherein aluminum saturated with approximately 1% silicon is used as cathode metalization.

16. The power semiconductor component as claimed in claim 1, wherein the cathode emitter regions are permeated by p-doped cathode emitter islands.

17. The power semiconductor component as claimed in claim 16, wherein the p-emitter is permeated by anode short circuit regions.

18. The power semiconductor component as claimed in claim 16, wherein an n-doped stop layer is provided between the n-base and the anode emitter.

19. The power semiconductor component as claimed in claim 16, wherein a) the anode emitters are implemented as interrupted regions which are surrounded by an n-doped stop layer, b) anode short circuit regions are provided in a fashion alternating with the anode emitter regions and stop layer regions, c) the n-base penetrates between the stop layer regions surrounding the anode emitter regions and the anode short circuit regions to the anode-side main surface; and d) a metalization covering the anode-side main surface is interrupted by insulation regions in the regions where the n-base penetrates to the anode-side main surface.

20. The power semiconductor component as claimed in claim 16, wherein a diffusion barrier layer is applied between the metal layer and the cathode-side main surface.

* * * * *